United States Patent
Nah et al.

(10) Patent No.: US 11,270,966 B2
(45) Date of Patent: Mar. 8, 2022

(54) COMBINATION POLYIMIDE DECAL WITH A RIGID MOLD

(71) Applicant: International Business Machines Corporation, Armonk, NY (US)

(72) Inventors: Jae-Woong Nah, Closter, NJ (US); Stephen L. Buchwalter, Anthem, AZ (US); Peter A. Gruber, Mohegan Lake, NY (US); Paul Alfred Lauro, Brewster, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/686,815

(22) Filed: Nov. 18, 2019

(65) Prior Publication Data

US 2021/0151402 A1    May 20, 2021

(51) Int. Cl.
*H01L 23/00* (2006.01)

(52) U.S. Cl.
CPC ............ *H01L 24/11* (2013.01); *H01L 24/742* (2013.01); *H01L 2224/111* (2013.01); *H01L 2224/11003* (2013.01); *H01L 2224/11334* (2013.01); *H01L 2224/11849* (2013.01)

(58) Field of Classification Search
CPC ................... H01L 24/11; H01L 24/742; H01L 2224/11334; H01L 2224/11003; H01L 2224/11849
See application file for complete search history.

(56) References Cited

U.S. PATENT DOCUMENTS

| | | | |
|---|---|---|---|
| 5,673,846 A | 10/1997 | Gruber | |
| 5,718,361 A | 2/1998 | Braun et al. | |
| 5,718,367 A | 2/1998 | Covell, II et al. | |
| 7,928,585 B2 | 4/2011 | Buchwalter et al. | |
| 8,002,164 B2 | 8/2011 | Shultz | |
| 8,669,137 B2 | 3/2014 | Nah et al. | |
| 8,765,593 B2 | 7/2014 | Ayotte et al. | |
| 2010/0025863 A1* | 2/2010 | Gruber | H01L 23/49816 257/778 |
| 2010/0028612 A1* | 2/2010 | Gruber | H01L 24/11 428/172 |
| 2010/0116871 A1* | 5/2010 | Gruber | B23K 3/0638 228/244 |
| 2014/0035150 A1* | 2/2014 | Gruber | B23K 26/40 257/772 |

FOREIGN PATENT DOCUMENTS

KR    101670217 B1    10/2016

* cited by examiner

*Primary Examiner* — Dung A. Le
(74) *Attorney, Agent, or Firm* — Daniel P. Morris; Lou Percello, Attorney, PLLC

(57) ABSTRACT

Protruding solder structures are created for electrical attachment of semiconductor devices. A rigid mold having one or more mold openings is attached to and used in combination with a decal structure that has one or more decal holes. The decal structure is disposed on the rigid mold so that the decal openings are aligned over the mold openings. Each of the decal hole and mold opening in contact form a single combined volume. The single combined volumes are filled with solder to form protruding solder structures. Various structures and methods of making and using the structures are disclosed.

20 Claims, 6 Drawing Sheets

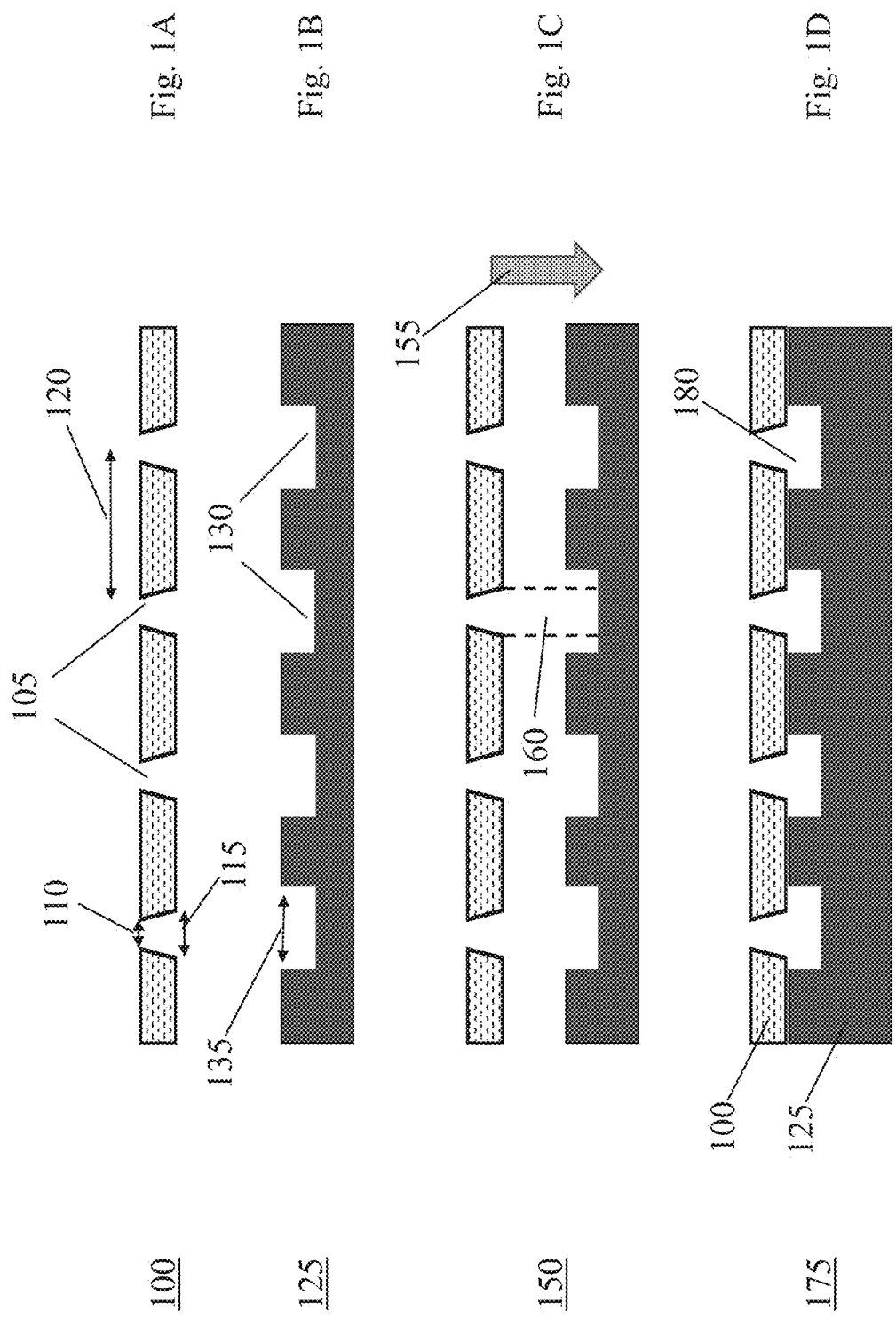

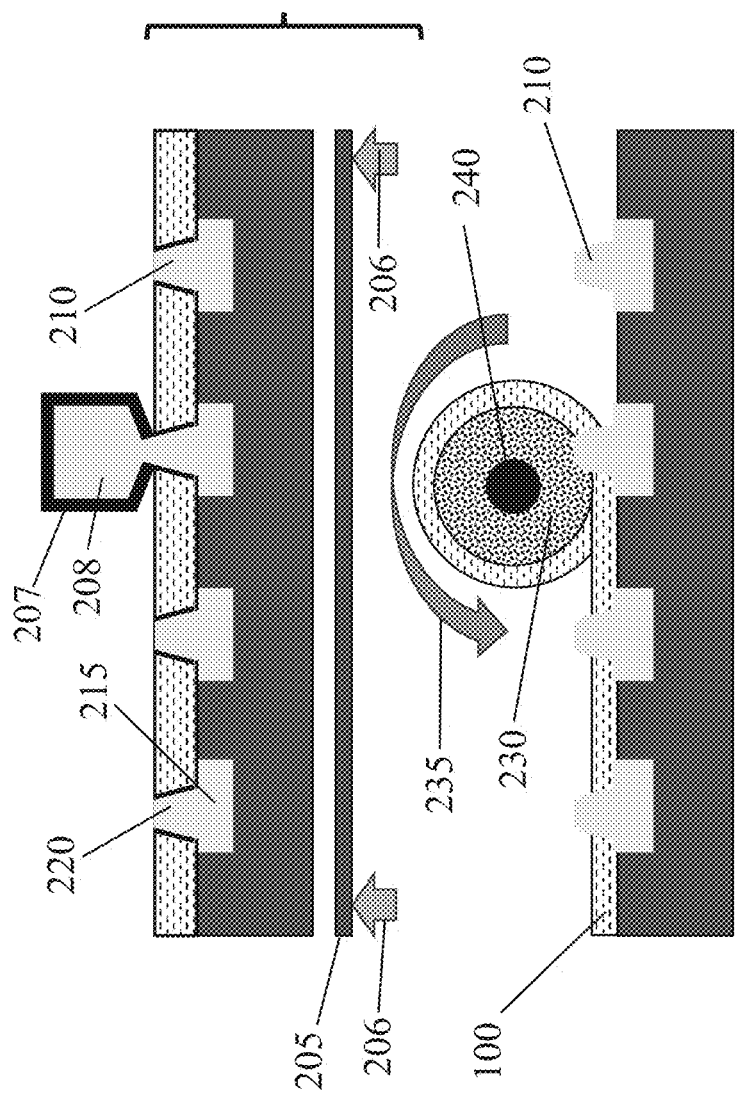

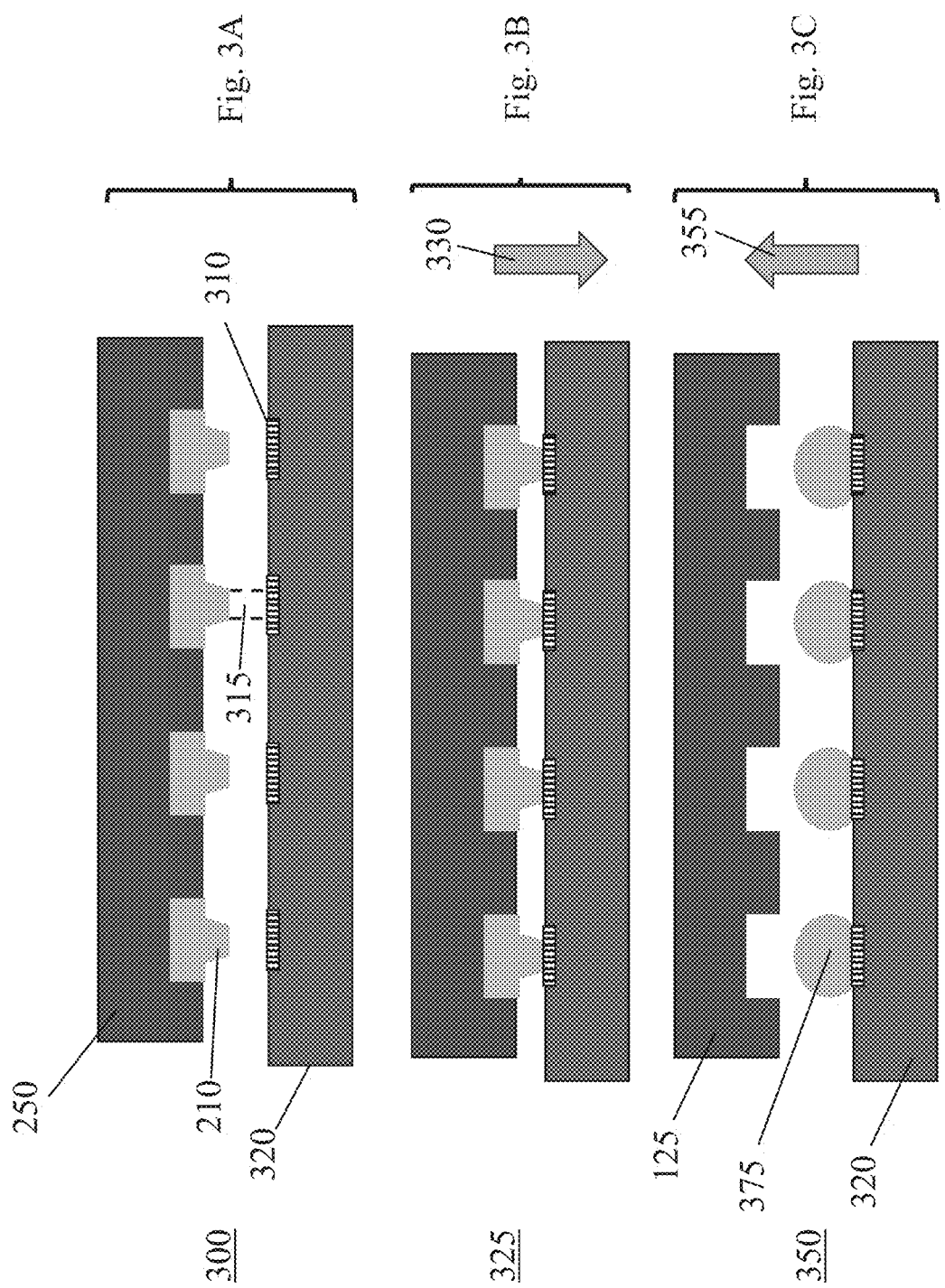

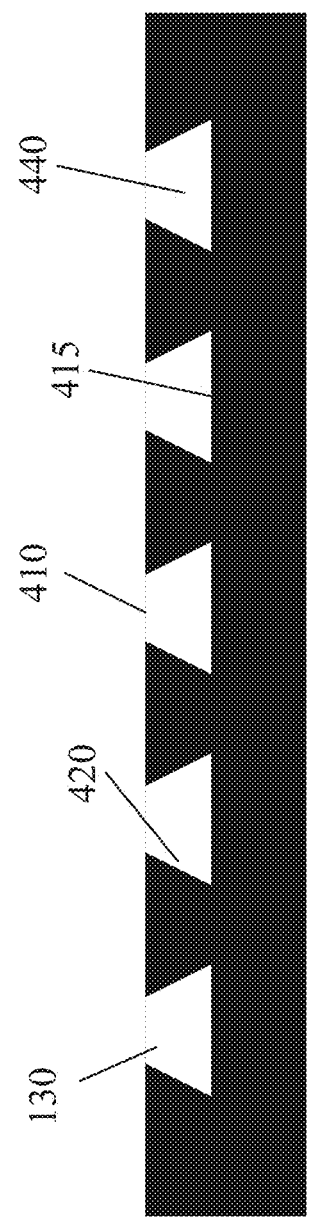
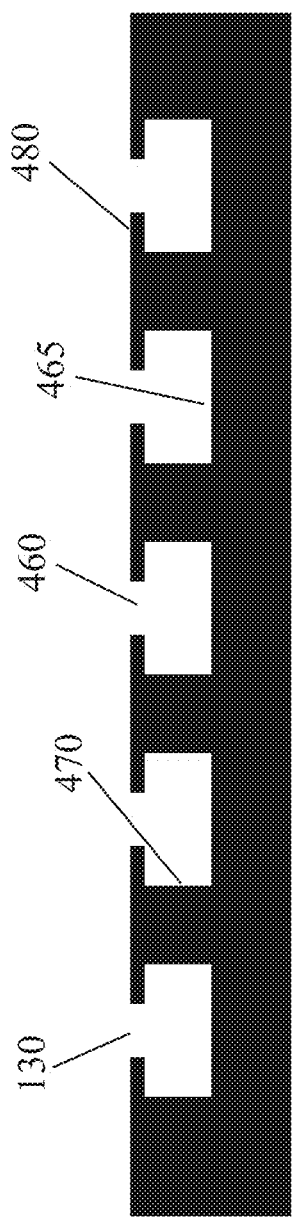

COMBINATION POLYIMIDE DECAL WITH A RIGID MOLD

BACKGROUND

The present invention relates to creating and connecting contacts on semiconductor devices. More specifically, this invention relates to a system, method, and apparatus for forming protruding solder features in a rigid mold using a decal layer.

Integrated circuit chip interconnections of standard electronic packaging applications routinely use evaporation, electroplating, and/or forming/placing of solder bumps. Evaporation and electroplating are costly processes and may involve many processing steps including photolithography.

Solder decals (or "decals") are a cheaper alternative to evaporation and electroplating and are used to form, move, and/or position solder bumps on semiconductor components, substrates (e.g., organic substrates), etc. See U.S. Pat. No. 5,673,846 "Solder Anchor Decal and Method" to Gruber and U.S. Pat. No. 7,928,585 "Sprocket Opening Alignment Process and Apparatus for Multilayer Solder Decal" to Buchwalter.

Some existing Injection Molded Soldering (IMS) techniques using two layers of decals placed together to form solder bumps. Once the solder bumps are made in the openings in the dual decal layers, e.g. by an IMS process, one of the decal layers is peeled off to create protruded solder structures. The protruded solder structures are used to create contacts on organic substrates, etc. Polymer film decals can bend to the topography of organic substrates and even can be rolled to a radius of curvature.

However, this method requires precise alignment between the decals. In addition, the decal alignment needs to be highly stable at high temperatures during the IMS.

As the dimensions of the solder connections become smaller and have a finer pitch, aligning dual decals used with these IMS techniques becomes more difficult. Compared to glass-based molds, the alignment between two flexible decals is hard to control. In addition, decals, like polyimide films, have a relatively short lifetime, limited reuse time in the IMS processes, and need to be replaced periodically.

There is a need to develop to alternative methods to improve the alignment and lifetime of decals, particularly for decals used to produce fine pitch solder bumps for connections.

SUMMARY

According to an embodiment of the present invention a protruding solder structure is created for electrical attachment of semiconductor devices. In one embodiment, the structure has a rigid mold having one or more mold openings where each mold opening has a mold opening dimension. The mold openings have a mold opening center-to-center pitch. A decal structure has one or more decal holes. The decal holes have a smaller top opening and a larger bottom opening. The larger bottom opening of the decal structure is smaller than the mold openings. The decal holes have a decal hole center-to-center pitch. The decal structure is disposed on the rigid mold so that the decal openings are aligned over the mold openings. Each of the decal hole and mold opening in contact form a single combined volume. The single combined volumes are filled with solder to form protruding solder structures. Various structures and methods of making and using the structures are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 1A is a cross section of a single decal structure with a plurality of openings/holes.

FIG. 1B is a cross section of a rigid mold with a plurality of mold openings.

FIG. 1C shows the decal structure being aligned with the rigid mold so the decal openings line up with the mold openings.

FIG. 1D shows a combination of the decal structure placed on the rigid mold so that the decal openings open into the mold openings.

FIG. 2A shows the combination of the decal structure and rigid mold with solder filling the combined decal openings and mold openings.

FIG. 2B shows the decal structure being removed leaving protruding solder structures in the mold openings.

FIG. 2C is a cross section view of the rigid mold containing the protruding solder structures in the mold openings.

FIG. 3A shows the rigid mold aligning the protruding solder structures over pads or ball-limiting metallurgy (BLMs) on the surface of a wafer.

FIG. 3B shows the rigid mold and wafer maintained in proximity while downward pressure is applied so that the protruding solder structures and respective BLMs make contact while heat is applied.

FIG. 3C shows the rigid mold and wafer separating leaving solder balls on the BLM.

FIG. 4A is a cross section of one alternative rigid mold.

FIG. 4B is a cross section of a second alternative rigid mold.

DETAILED DESCRIPTION

Figure 5:
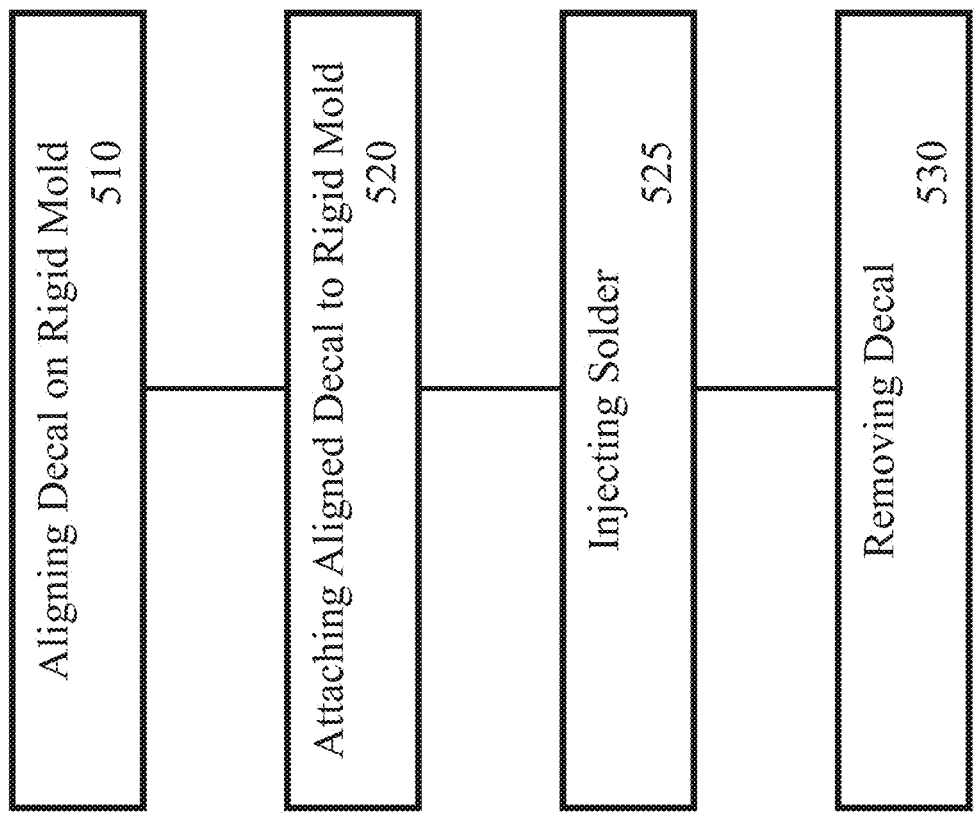
FIG. 5 is a flow chart of a protruding solder structure formation process.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

One embodiment of this invention is related to a manufacturable soldering method on organic and other substrates with fine pitch connections or input/output connections (I/O's).

FIG. 1A is a cross section of a single decal structure with a plurality of openings.

In some embodiments, the decal 100 is a flexible "ribbon-like" material that has a series of through holes 105 passing through the decal 100. The holes 105 can be created by mechanical punches, laser penetration, or chemical etching methods. The decal 100 can be made from polyimide, rubber, polytetrafluoroethylene (PTFE), metal foil, etc.

In some embodiments, the decal holes 105 are a non-uniform shape. For example, in cross section, the decal holes 105 can be trapezoidal-shaped with a smaller opening 110 on a first (e.g. top) side of the decal 100 and a larger opening 115 on a second (e.g. bottom) side of the decal 100. The decal holes have a pitch or spacing 120 (e.g. decal hole center-to-center distance) dependent on the density, pitch, or fineness of the solder balls that will ultimately be placed on a substrate. Other cross-sectional shapes of the decal holes 105 are envisioned.

In some embodiments, the narrow opening 110 of the decal hole 105 is between 0.5 and 6 mils (one thousandth of an inch); the wider opening 115 of the decal hole 105 is between 1 to 8 mils; and the on-center spacing 120 of the decal holes 105 is between 3 to 20 mils. In some embodiments, the wider opening 115 of the decal hole 105 is less than on-center spacing 120. Other dimensions are envisioned.

In some embodiments, the decal holes 105 can be placed in a pattern and/or array on the decal 100.

FIG. 1B is a cross section of a rigid mold 125 with a plurality of mold openings 130 used to make solder bumps. In some embodiments, the center-to center pitch/spacing of the mold openings 130 can be about the same as that 120 of the decal holes 105. The mold opening dimension 135 is between 1 to 25 mil (or even 40 mils) and in some embodiments is wider than the wider opening 115 of the decal holes 105. The mold openings can be circular or rectangular in shape although other shapes are envisioned. Examples of other embodiments are given below.

The rigid mold 125 is made of a rigid material like silicon, glass, metal, ceramic, etc. The mold openings 130 can be made using known patterning and etching techniques.

FIG. 1C shows the decal structure 100 being aligned 155 with the rigid mold 125 so the decal holes 105 line up with the mold openings 130. In some embodiments, the rigid mold openings 130 and decal holes 105 are aligned when most or all the wider opening 115 of the decal holes 105 project 160 into the mold openings 130.

FIG. 1D shows a combination 175 of the decal structure 100 aligned, placed on, and in contact with the rigid mold 125 so that the openings of the decal holes 105 and the openings of the mold openings 130 are in fluid communication, e.g. the volumes of the decal holes 105 and mold openings 130 form a single combined volume 180.

FIG. 2A shows the combination 200 of the decal structure 100 and rigid mold 125, e.g. the combination 175, after solder is injected, filling the respective combined volumes 180 created by the decal openings 105 and mold openings 130. A protruding solder structure 210 is formed in each of the combined volumes 180. Each of the protruding solder structures 210 has a base region 215 that has a larger volume and larger cross-section area than a protruding region 220.

In some embodiments, the solder is injected by existing Injection Molded Soldering (IMS) techniques into the narrow openings 110 of the decal holes 105. In a preferred embodiment, the solder is injected in a Nitrogen environment.

In some embodiments, a plate 205 pushes 206 the rigid mold 125 against the decal structure 100 forcing the decal structure 100 between the plate 205 and a solder fill head 207. The solder fill head 207 has a casing that contains a solder supply in a solder chamber 208.

FIG. 2B shows the decal structure 100 being removed, leaving protruding solder structures 210 in the mold openings 130.

In some embodiments the decal structure 100 is rolled up on a roller 230 turning 235 on an axis 240. As the roller 230 turns 235, the decal structure 100 is separated from the protruding solder structures 210. Decal structure 100 removal is facilitated since the wider dimension 115 of the decal hole 105 is at the bottom of the decal 100. In some embodiments, during separation, the protruding solder structures 210 are at a temperature at which the protruding solder structures 210 have solidified.

FIG. 2C is a cross section view of the rigid mold 125 containing the protruding solder structures 210 in the mold openings 130.

FIG. 3A shows the rigid mold (125, 250) containing the protruding solder structures 210 aligning the protruding solder structures 210 over pads 310 or ball-limiting metallurgy (BLMs) 310 on the surface of a wafer 320. The alignment is completed when the projection 315 of the protruding region 220 of the protruding solder structures 210 projects entirely within and/or covers the BLM 310.

FIG. 3B shows the rigid mold (125, 250) and wafer 320 moving 330 into proximity so that the protruding region 220 of the protruding solder structures 210 and respective BLMs 310 make contact while heat is applied. The amount of heat and the time the heat applied depends on the type and flow characteristics of the solder used in the protruding solder structures 210. In some embodiments, while the protruding region 220 and the respective BLM 310 are in contact, the heat is applied at a temperature above the melting point of the protruding solder structure 210 causing the solder to melt and flow within 0.2 seconds or less.

FIG. 3C shows the rigid mold 125 and wafer separating 355, removing the rigid mold 125, and leaving the solder balls 375 physically and electrically attached to the BLM 310.

In some embodiments, pads 310 or ball-limiting metallurgy (BLMs) 310 are lower than the surface of a wafer 320. The protruding solder structures 210 enable the solder to contact the recessed pads 310 and form solder bumps on the pads 310.

FIG. 4A is a cross section of one alternative embodiment of a rigid mold 400 with mold openings 130 that have sides sloping to undercut the surface aperture 410 of the mold opening 130 causing a broader base 415 of the volume 440 of the mold opening 130.

FIG. 4B is a cross section of a second alternative embodiment of the rigid mold 450. This embodiment 450 has mold openings 130 with rectangularly shaped sides 470 (in cross-section) and a surface aperture 460 that is smaller than the internal cross-section of the mold opening 130. In other words, the mold opening 130 has sides 470 that undercut the surface aperture 460 and are perpendicular to the base 465 of the volume of the mold opening 130. In this embodiment, lip-like structures 480 close the mold opening 130 so that the aperture 460 has a smaller area than the base 465 of the volume of the mold opening 130.

In both these embodiments (400, 450) the smaller surface aperture (410, 460) acts to retain the base region 215 of the protruding solder structures 210 within the mold opening 130 while the decal structure 100 is being peeled away.

Other shapes of the mold opening 130 are envisioned to accomplish this purpose. These under cutting mold opening 130 shapes do not affect the flow of the solder onto the BLM 310 once the heat is applied.

FIG. 5 is a flow chart of a protruding solder structure formation process 500.

Step 510 begins the process 500 by aligning (155, 510) the decal holes 105 of the decal structure 100 with the respective rigid mold openings 130 in the rigid mold 125, as described above.

Step 520 attaches the aligned decal structure 100 to the rigid mold 125. In some embodiments, a plate 205 pushes 206 the rigid mold 125 against the decal structure 100 forcing the decal structure 100 between the plate and a solder fill head 207. The solder fill head 207 has a casing that contains a solder supply in a solder chamber 208. The solder chamber has an opening under which the decal moves.

In step 525, when a decal hole passes under the solder chamber opening, the solder fill head 207 injects, e.g. by IMS, hot solder into each of the volumes, e.g. 180, created by the combination of the decal holes 105 and mold openings 130. While passing under the solder chamber 208 the decal structure 100, mold 125, plate 205, and solder fill head keep the solder chamber opening and the decal holes 105 in tight contact with the solder chamber so the decal holes 105 and respective mold holes 130 fill with solder.

In step 530, the decal structure 100 is removed from the rigid mold 125, leaving the protruding solder structure 210.

Figure 6:
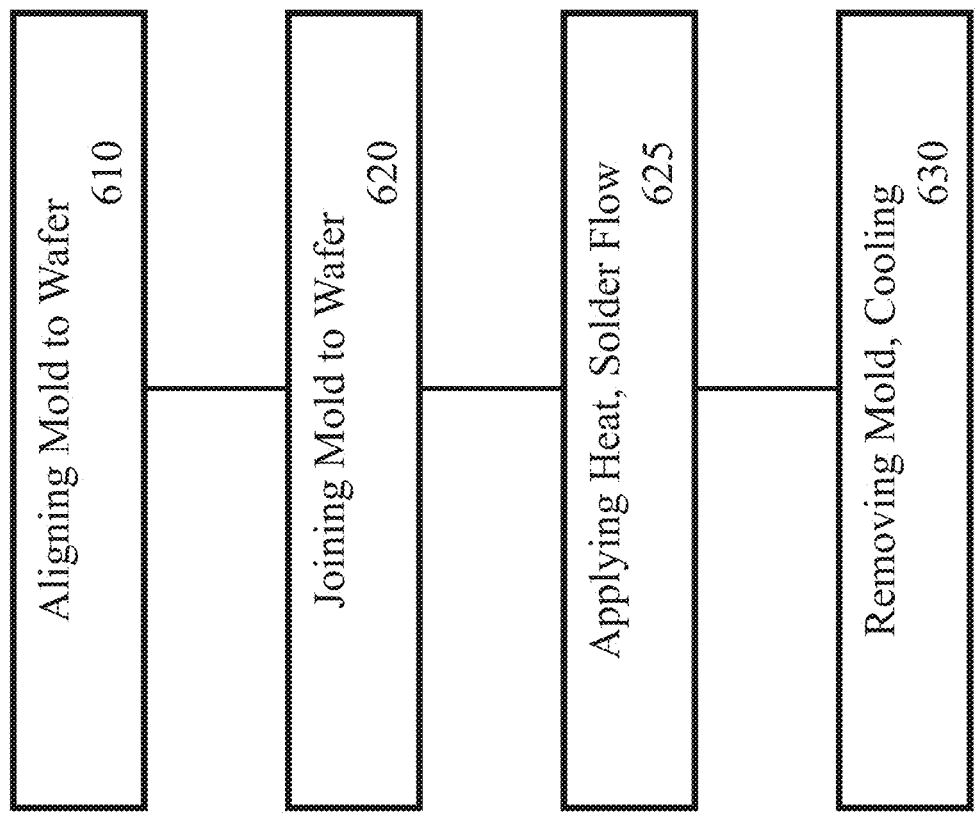
FIG. 6 is a flow chart of a solder ball formation process.

FIG. 6 is a flow chart of a solder ball formation process 600.

Step 610 begins process 600 by aligning protruding solder structures 210 within the rigid mold 125 with positions/sites, e.g. BLMs 310, on the wafer 320.

Step 620 joins the wafer 320 and rigid mold 125 by pushing them together and forcing contact between the aligned 610 protruding solder structures 210 and the respective BLM 310 positions/sites on the wafer 320.

In step 625 heat is applied while the protruding solder structures 210 and the BLMs 310 are in contact. The temperature of the protruding solder structures 210 is raised above the melting point of the solder. In under 0.2 seconds the solder flows out of the rigid mold 125 onto the sites 310.

In step 630, the rigid mold 125 is separated (removed) from the wafer 320 and the solder cools forming a solder ball 375 electrically and physically connected to each of the one or more BLM 310 sites.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Devices, components, elements, features, apparatus, systems, structures, techniques, and methods described with different terminology that perform substantially the same function, work in the substantial the same way, have substantially the same use, and/or perform the similar steps are contemplated as embodiments of this invention.

Semiconductor devices, structures, and methods disclosed in accordance with embodiments of the present invention can be employed in a variety of applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc.

We claim:

1. A structure comprising:
    a rigid mold having one or more mold openings, each mold opening having a mold opening dimension of a surface aperture of each of the mold opening and an internal cross-section of the mold opening with one or more mold opening sides, where the surface aperture is smaller than the internal cross-section and the mold opening sides undercut the surface aperture, and the mold openings having a mold opening center-to-center pitch; and
    a decal structure having one or more decal holes, the decal holes having a smaller top opening and a larger bottom opening, the larger bottom opening being smaller than the mold openings, the decal holes having a decal hole center-to-center pitch, the decal structure disposed on the rigid mold so that the decal openings are aligned over the mold openings,
wherein each respective decal hole and mold opening in contact form a single combined volume and wherein the surface aperture is capable of retaining a solder structure in the single combined volume while the decal structure is peeled away from the solder structure.

2. A structure, as in claim 1, where one or more of the single combined volumes is filled with solder forming a protruding solder structure.

3. A structure, as in claim 2, where the protruding solder structure has a base region and a protruding region.

4. A structure, as in claim 3, where base region has a larger volume and larger cross-section area than the protruding region.

5. A structure, as in claim 1, where the decal holes are a non-uniform shape.

6. A structure, as in claim 5, where the decal holes have a trapezoidal-shaped cross-section.

7. A structure, as in claim 1, where the mold opening dimension is between 1 to 25 mil.

8. A structure, as in claim 1, where the decal hole larger bottom opening is between 1 and 8 mils.

9. A structure, as in claim 1, where the rigid mold is made of one or more of the following: silicon, glass, metal, and ceramic.

10. A structure, as in claim 1, where the decal structure is made of one or more of the following: polyimide, rubber, polytetrafluoroethylene (PTFE), and metal foil.

11. A structure, as in claim 1, where one or more of the mold openings has a surface aperture, sides, and a base, the base being wider than the aperture.

12. A structure, as in claim 11, where the sides are sloping and undercut the surface aperture of the mold opening.

13. A structure, as in claim 11, where the sides are perpendicular to the base, the mold opening as a rectangular cross-section, and a lip forms the surface aperture.

14. A method of making a protruding solder structure comprising the steps of:
    aligning a decal structure over a rigid mold, the rigid mold having a plurality of mold openings with a mold opening center-to-center pitch, each mold opening having a surface aperture and a mold opening internal cross-section with one or more mold opening sides, where the surface aperture is smaller than the internal cross-section and the mold opening sides undercut the surface aperture to form a lip around the surface aperture, the decal structure having one or more decal holes, the decal holes having a smaller top opening and a larger bottom opening, the larger bottom opening being smaller than the mold openings, the decal holes having a decal hole center-to-center pitch, the aligning being complete when the projection of one or more of the larger bottom openings is within the respective mold opening;
    attaching the aligned decal structure to the rigid mold, where one or more of the decal holes and respective aligned mold openings form a single combined volume;
    filling each of the combined volumes with solder; and
    removing the decal structure from the rigid mold,
wherein a protruding solder structure remains in each of the mold openings retained by the lip.

15. A method, as in claim 14, where the filling is done by a trill head with solder in a chamber.

16. A method, as in claim 14, where a plate forces the decal structure and d mold together.

17. A method, as in claim 14, where removing the decal structure is performed by a roller.

18. A method, as in claim 14, further comprising the steps of:
    aligning protruding solder structures within the rigid mold with sites on a wafer; and
    joining the wafer and rigid mold and forcing contact between the aligned protruding solder structures and the respective sites on the wafer.

19. A method, as in claim 18, further comprising the steps of:
    applying heat to melt the protruding solder structures;
    removing the rigid mold; and
    cooling the solder to form the solder balls electrically and physically connected to each of the sites.

20. The method, as in claim 17, of forming a solder ball by further comprising the steps of:
    aligning one or more of the protruding solder structures within a rigid mold with sites on a wafer;
    joining the water and rigid mold and forcing contact between the aligned protruding solder structures and the respective sites on the wafer;
    applying heat to melt the protruding solder structures;
    removing the rigid mold; and
    cooling the solder to form the solder balls electrically and physically connected to each of the sites.

* * * * *